(12) United States Patent
Park

(10) Patent No.: US 8,835,205 B2
(45) Date of Patent: Sep. 16, 2014

(54) ORGANIC LIGHT-EMITTING DISPLAY DEVICE AND METHOD OF MANUFACTURING THE SAME

(75) Inventor: Yong-Woo Park, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 233 days.

(21) Appl. No.: 13/022,530

(22) Filed: Feb. 7, 2011

(65) Prior Publication Data

US 2011/0198596 A1 Aug. 18, 2011

(30) Foreign Application Priority Data

Feb. 16, 2010 (KR) .................. 10-2010-0013846

(51) Int. Cl.
*H01L 21/00* (2006.01)

(52) U.S. Cl.
USPC .................................. 438/34; 257/E51.018

(58) Field of Classification Search
USPC ............ 257/59, 98, E51.018, 72; 438/22, 30, 438/34, 149
See application file for complete search history.

(56) References Cited

U.S. PATENT DOCUMENTS

| | | | |
|---|---|---|---|
| 7,842,947 B2 | 11/2010 | Nakatani et al. | |
| 7,863,811 B2 | 1/2011 | Jun et al. | |
| 2004/0135501 A1 | 7/2004 | Nishikawa | |
| 2005/0046342 A1* | 3/2005 | Park et al. | 313/504 |
| 2005/0116240 A1* | 6/2005 | Kim et al. | 257/88 |
| 2005/0116631 A1* | 6/2005 | Kim et al. | 313/506 |
| 2005/0285516 A1* | 12/2005 | Godo et al. | 313/506 |
| 2006/0043360 A1* | 3/2006 | Kim et al. | 257/40 |
| 2006/0223221 A1 | 10/2006 | Ishii | |
| 2008/0108205 A1* | 5/2008 | Nishi et al. | 438/463 |
| 2009/0194780 A1 | 8/2009 | Kwon | |

(Continued)

FOREIGN PATENT DOCUMENTS

| | | |
|---|---|---|
| JP | 2006-004743 | 1/2006 |
| JP | 2007-044582 | 2/2007 |

(Continued)

OTHER PUBLICATIONS

KIPO Office action dated May 17, 2011, for Korean priority Patent application 10-2010-0013846.

(Continued)

*Primary Examiner* — Daniel Luke
*Assistant Examiner* — Latanya N Crawford
(74) *Attorney, Agent, or Firm* — Christie, Parker & Hale, LLP

(57) ABSTRACT

An organic light-emitting display device including a pixel-defining layer and a spacer, and a method of manufacturing the same. The method includes: forming an organic insulating material layer on a pixel electrode; placing a half-tone mask including a light-blocking portion, a partial-transmitting portion, and a light-transmitting portion on the organic insulating material layer and performing an exposure process so that the pixel electrode corresponds to the light-transmitting portion, a pixel-defining layer at least partially surrounding the pixel electrode corresponds to the partial-transmitting portion, and a spacer adjacent to the pixel-defining layer corresponds to the light-blocking portion; and etching a portion of the organic insulating material layer that is exposed so that a pixel area on the pixel electrode is at least partially surrounded by the pixel-defining layer and the spacer. A taper angle of the pixel-defining layer is between about 15 degrees to about 30 degrees.

6 Claims, 3 Drawing Sheets

(56) References Cited

U.S. PATENT DOCUMENTS

| | | | |
|---|---|---|---|
| 2010/0045173 A1* | 2/2010 | Kwon et al. | 313/504 |
| 2010/0330468 A1* | 12/2010 | Kwon et al. | 430/5 |
| 2012/0235144 A1* | 9/2012 | Choung et al. | 257/57 |

FOREIGN PATENT DOCUMENTS

| | | |
|---|---|---|
| JP | 2008-210653 | 9/2008 |
| JP | 2009-54603 | 3/2009 |
| KR | 10-2006-0105495 | 10/2006 |
| KR | 10-20080029279 A | 4/2008 |
| KR | 10-0833773 B1 | 5/2008 |
| KR | 10-0838090 | 6/2008 |
| KR | 10-20080057412 A | 6/2008 |
| KR | 10-2009-0084202 | 8/2009 |
| WO | WO 2009/147838 A1 | 12/2009 |

OTHER PUBLICATIONS

KIPO Registration Determination Certificate dated Oct. 31, 2011 for KR Application No. 10-2010-0013846 (5 pages).

Official Action issued by the Japanese Patent Office on Feb. 21, 2012 in the examination of Japanese Patent Application No. 2010-153805, 2 pgs.

\* cited by examiner

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2010-0013846, filed on Feb. 16, 2010, in the Korean Intellectual Property Office, the entire content of which is incorporated herein by reference.

BACKGROUND

1. Field

An embodiment of the present invention relates to an organic light-emitting display device and a method of manufacturing the same.

2. Description of Related Art

In general, organic light-emitting display devices are self-emissive display devices which include a pixel electrode, a counter electrode, and an organic light-emitting layer between the pixel electrode and the counter electrode such that when an appropriate anode voltage and an appropriate cathode voltage are applied to the electrodes, light is emitted from the organic light-emitting layer.

As the sizes of organic light-emitting display devices have recently increased, the organic light-emitting layers have been formed by a printing process, such as nozzle printing or inkjet printing, which obviates the need to use a mask, more often than they have been formed by a mask process.

In order to form the organic light-emitting layer by using a printing process, a barrier may be used to prevent an organic light-emitting layer solution that is ejected into a pixel area from penetrating into an adjacent pixel area. A spacer and a pixel-defining layer may serve as the barrier.

The pixel-defining layer at least partially surrounds and separates each pixel from other pixels. The spacer projects from the pixel-defining layer and acts as a barrier for preventing the organic light-emitting layer solution from penetrating into an adjacent pixel area.

SUMMARY

Because a conventional manufacturing method involves patterning the pixel-defining layer on the pixel electrode and patterning the spacer on the pixel-defining layer, a two-mask process may need to be performed to form the pixel-defining layer and the spacer. Accordingly, research for a simpler manufacturing processes is ongoing.

Accordingly, an aspect of the present invention provides an organic light-emitting display device in which a pixel-defining layer and a spacer are formed using a single-mask process. Another aspect of the present invention provides a method of manufacturing the organic light-emitting display device.

According to one embodiment of the present invention, there is provided an organic light-emitting display device including: a pixel electrode electrically coupled to a thin film transistor; a pixel-defining layer at least partially surrounding the pixel electrode and defining a pixel area; a spacer adjacent to the pixel-defining layer; a second electrode corresponding to the pixel electrode; and an organic light-emitting layer between the pixel electrode and the second electrode, wherein a taper angle of the pixel-defining layer between the pixel electrode and the organic light-emitting layer is in the range of about 15 degrees to about 30 degrees.

The pixel-defining layer may have a thickness of less than about 4000 Å. The spacer may be integrally projecting from the pixel-defining layer. The second electrode may be facing the pixel electrode.

Another embodiment of the present invention provides a method of manufacturing an organic light-emitting display device including: forming an organic insulating material layer on a pixel electrode; placing a half-tone mask including a light-blocking portion, a partial-transmitting portion, and light-transmitting portion on the organic insulating material layer; performing an exposure process so that the pixel electrode corresponds to the light-transmitting portion, a pixel-defining layer at least partially surrounding the pixel electrode corresponds to the partial-transmitting portion, and a spacer adjacent to the pixel-defining layer corresponds to the light-blocking portion; and etching a portion of the organic insulating material layer so that a pixel area on the pixel electrode is at least partially surrounded by the pixel-defining layer and the spacer corresponding to the exposure process.

The exposure process may include a defocusing process, wherein at least one beam of light is focused away from an exposed surface of the organic insulating material layer. The defocusing process may include focusing the at least one beam of light about 10 μm to about 15 μm from the exposed surface of the organic insulating material layer. A taper angle of the pixel-defining layer between the pixel electrode and the organic light-emitting layer in the pixel-defining layer may be between about 15 degrees to about 30 degrees. The pixel-defining layer may have a thickness of less than about 4000 Å. The light-blocking portion may have a light transmittance of about 0%, the partial-transmitting portion may have a light transmittance of about 40% to about 70%, and the light-transmitting portion may have a light transmittance of about 100%. The portion of the organic insulating material layer may be exposed during the exposure process. The method may also include preparing the half-tone mask.

According to embodiments of the present invention, a pixel-defining layer and a spacer may be formed by using a single-mask process using a half-tone mask, the manufacturing process may be simplified, and a uniform organic light-emitting layer may be formed by reducing a taper angle of the pixel-defining layer.

BRIEF DESCRIPTION OF THE DRAWINGS

The accompanying drawings, together with the specification, illustrate exemplary embodiments of the present invention and, together with the description, serve to explain the principles of embodiments of the present invention.

DETAILED DESCRIPTION

Figure 1:
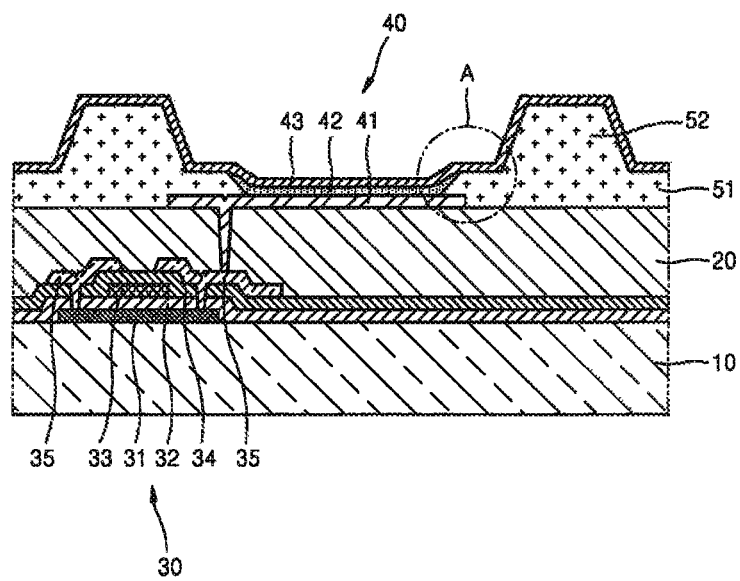
FIG. 1 is a cross-sectional view of an organic light-emitting display device according to an embodiment of the present invention.
Figure 2:
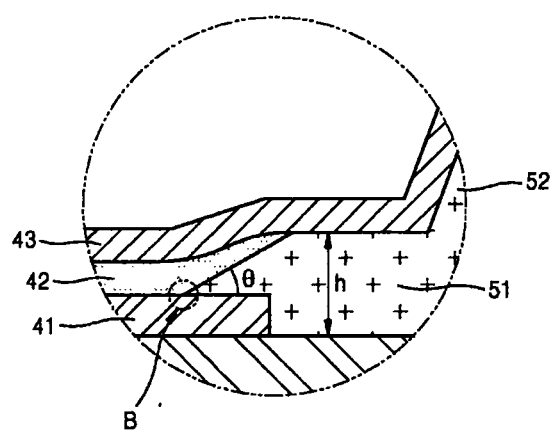
FIG. 2 is an enlarged view illustrating portion A of FIG. 1.

Hereinafter, certain exemplary embodiments according to the present invention will be described with reference to the accompanying drawings. Here, when a first element is described as being coupled to a second element, the first element may be directly coupled to the second element or may be indirectly coupled to the second element via one or more additional elements. Further, some of the elements that are not essential to a complete understanding of the invention are omitted for clarity. Also, like reference numerals refer to like elements throughout.

Hereinafter, exemplary embodiments of the present invention are described in detail with reference to FIGS. 1 to 3B.

FIG. 1 is a cross-sectional view illustrating an organic light-emitting display device according to one embodiment of the present invention.

Referring to FIG. 1, the organic light-emitting display device according to one embodiment of the present invention includes a thin film transistor (TFT) 30 formed on a substrate 10, and also includes an organic light-emitting element 40. It should be understood that although FIG. 1 illustrates one pixel of the organic light-emitting display device, the organic light-emitting display device may include a plurality of pixels.

The TFT 30 includes: an active layer 31 formed on the substrate 10; a first insulating layer 32 covering the active layer 31; a gate electrode 33 formed on the first insulating layer 32; a second insulating layer 34 formed on the first insulating layer 32 and covering the gate electrode 33; and source/drain electrodes 35 respectively coupled to the active layer 31 for coupling the active layer 31 to a pixel electrode 41 of the organic light-emitting element 40. Accordingly, if an appropriate voltage is applied to the gate electrode 33, current begins to flow to the pixel electrode 41 through the active layer 31 and the source/drain electrodes 35.

Additionally, a buffer layer (not shown) for preventing penetration of impurities and for achieving planarization of the substrate 10 may be disposed on a top surface of the substrate 10.

A passivation layer 20 may include an inorganic insulating layer or an organic insulating layer. If the passivation layer 20 includes an inorganic insulating layer, the inorganic insulating layer may include $SiO_2$, $SiN_x$, $SiON$, $Al_2O_3$, $TiO_2$, $Ta_2O_5$, $HfO_2$, $ZrO_2$, BST, and/or PZT. If the passivation layer 20 includes an organic insulating layer, the organic insulating layer may include polymethyl methacrylate (PMMA), a phenol-containing polymer derivative, an acryl-based polymer, an imide-based polymer, an arylether-based polymer, an amide-based polymer, a fluorine-based polymer, a p-xylene-based polymer, a vinylalcohol-based polymer, and/or a blend thereof. Alternatively, the passivation layer 20 may include both an inorganic insulating layer and an organic insulating layer that are stacked.

The pixel electrode 41 of the organic light-emitting element 40 contacting the source/drain electrodes 35 is formed on the passivation layer 20.

A pixel-defining layer 51, which at least partially surrounds the pixel electrode 41 and defines a pixel area, is formed (e.g., integrally formed) with a spacer 52 on the passivation layer 20. An organic light-emitting layer 42 and a counter electrode 43 (which may be referred to as a second electrode) of the organic light-emitting element 41 are formed (e.g., sequentially formed) on the pixel electrode 41.

The organic light-emitting element 40, which is electrically coupled to the TFT 30 and is configured to emit light, includes the pixel electrode 41 electrically coupled to the TFT 30, the second electrode 43 that is a common electrode, and the organic light-emitting layer 42 between the pixel electrode 41 and the second electrode 43. Accordingly, if a voltage is applied to the pixel electrode 41 from the TFT 30 to generate an electric field between the pixel electrode 41 and the second electrode 43, the organic light-emitting layer 42 may emit light.

If the organic light-emitting display device is a top emission organic light-emitting display device, whereby light is emitted in a direction toward the second electrode 43, then the pixel electrode 41 may be reflective. To this end, the pixel electrode 41 may include a reflective layer formed of an alloy such as aluminum (Al) or silver (Ag).

If the pixel electrode 41 is used as an anode, the pixel electrode 41 may include a layer formed of a metal oxide with a high work function (absolute value) such as indium tin oxide (ITO), indium zinc oxide (IZO), or zinc oxide (ZnO). If the pixel electrode 41 is used as a cathode, the pixel electrode 41 may be formed of a metal with a high conductivity and a low work function (absolute value) such as silver (Ag), magnesium (Mg), aluminum (Al), platinum (Pt), lead (Pd), gold (Au), nickel (Ni), neodymium (Nd), iridium (Ir), chromium (Cr), lithium (Li), or calcium (Ca). Accordingly, in this case, the aforesaid reflective layer is not necessary.

The second electrode 43 may be a transmissive electrode. To this end, the second electrode 43 may include a partial-transmitting reflective layer formed of Ag, Mg, Al, Pt, Pd, Au, Ni, Nd, Ir, Cr, Li, or Ca, or a light-transmitting metal oxide such as ITO, IZON, or ZnO. If the pixel electrode 41 is used as an anode, the second electrode 43 may be used as a cathode. Conversely, if the pixel electrode 41 is used as a cathode, the second electrode 43 may be used as an anode.

The organic light-emitting layer 42 between the pixel electrode 41 and the second electrode 43 may be formed by stacking all or some of a hole injection layer, a hole transport layer, a light-emitting layer, an electron injection layer, and an electron transport layer. The organic light-emitting layer 42 includes the light-emitting layer.

The organic light-emitting layer 42 may be formed by a printing process such as inkjet printing or nozzle printing. That is, the organic light-emitting layer 42 may be formed by ejecting an ink droplet into the pixel area defined by the pixel-defining layer 51 and the spacer 52 to fill the pixel area with the ink droplet and then drying the ink droplet.

Since it is undesirable for the ink droplet to penetrate into an adjacent pixel area, the pixel-defining layer 51 and the spacer 52 may act as a barrier. If the pixel-defining layer 51 is too thick in a limited space, however, a taper angle θ (see FIG. 2) toward the pixel area may be too large. In this case, the ink droplet may not be uniformly filled in a region B (see FIG. 2) corresponding to a boundary between the pixel area and the pixel-defining layer 51, thereby potentially leading to a poor quality pixel. Accordingly, the pixel-defining layer 51 may have a thickness "h" (see FIG. 2) of less than about 4000 Å and the taper angle θ (see FIG. 2) may be between about 15 degrees to about 30 degrees.

If the pixel-defining layer 51 is too thin, since the pixel-defining layer 51 cannot act alone as a barrier, the spacer 52 should be formed without fail. However, if the pixel-defining layer 51 and the spacer 52 are formed by using masks corresponding to patterns of the pixel-defining layer 51 and the spacer 52, then the manufacturing process may be complicated. Accordingly, a half-tone mask 100, as illustrated in FIG. 3B, may be used.

Figure 3A:
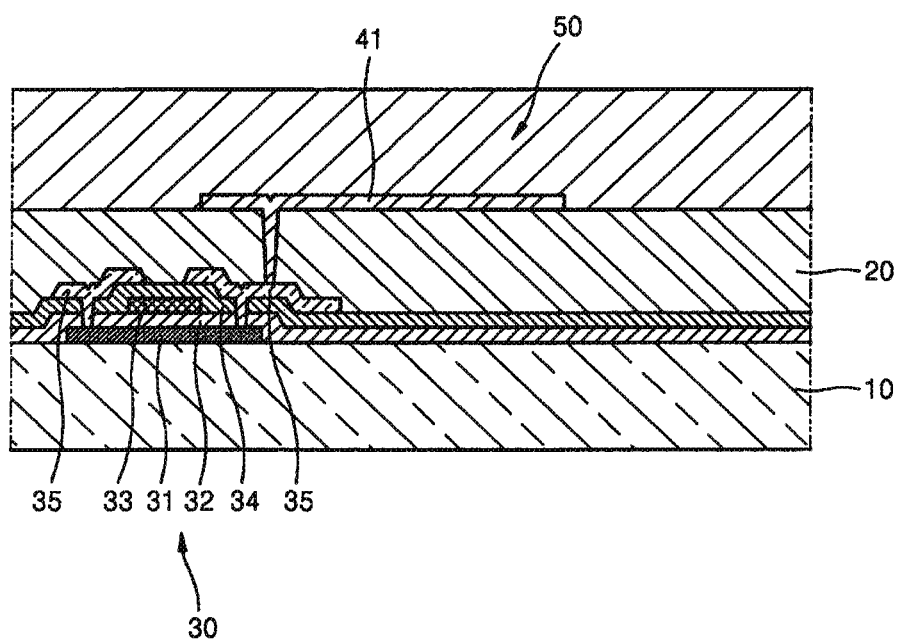
FIGS. 3A and 3B are cross-sectional views illustrating an embodiment of the present invention wherein a method of manufacturing is used to form the embodiment of the organic light-emitting display device of FIG. 1.
Figure 3B:
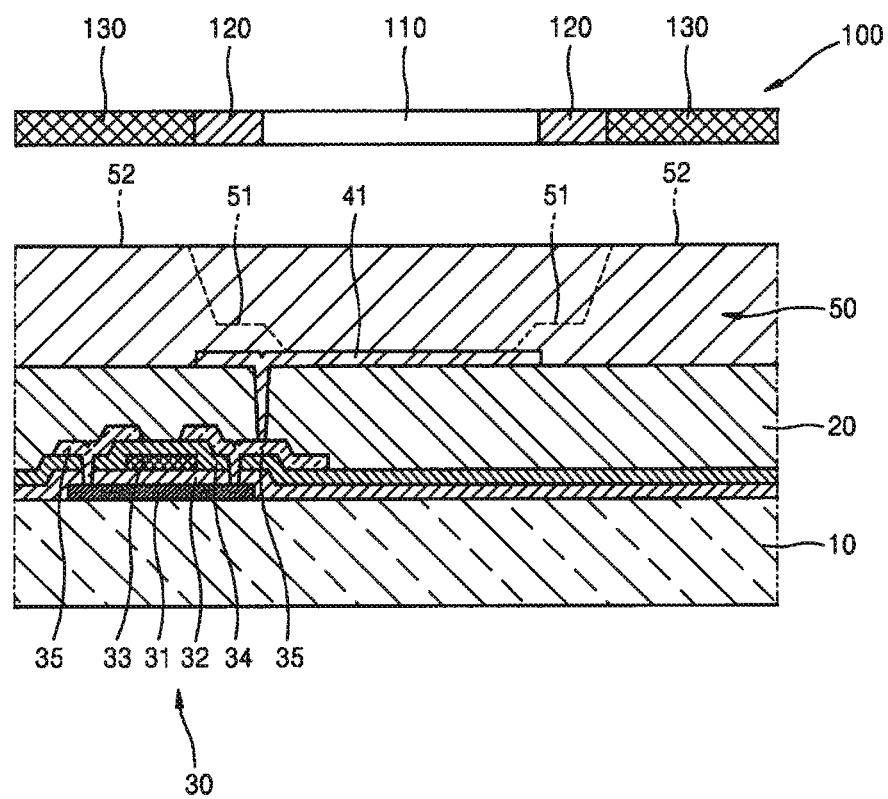

FIGS. 3A and 3B illustrate one embodiment of the present invention wherein a process of manufacturing the pixel-defining layer 51 and the spacer 52 uses the half-tone mask 100.

Referring to FIG. 3A, an organic insulating material layer 50 for forming the pixel-defining layer 51 and the spacer 52 may be formed on the pixel electrode 41. The organic insulating material layer 50 may be formed of polyimide or the like. The foregoing materials are provided merely as examples, and should not be interpreted as limiting the present invention or embodiments thereof.

Referring to FIG. 3B, the half-tone mask 100 is placed on the organic insulating material layer 50 and an exposure process is performed. Due to the half-tone mask 100, the exposure process may be performed on the pixel area on which the pixel electrode 41 is disposed, an area on which the pixel-defining layer 51 is to be formed, and an area on which the spacer 52 is to be formed. Conventionally, this may have been formed with different doses and at different times.

The half-tone mask 100 includes a light-transmitting portion 110 that transmits light (that is, has a light transmittance of about 100%), a light-blocking portion 130 that blocks light (that is, has a light transmittance of about 0%), and a partial-transmitting portion 120 which partially transmits light. The exposure process may be performed by placing the half-tone mask 100 so that the light-transmitting portion 110 corresponds to the pixel area of the pixel electrode 41, so that the partial-transmitting portion 120 corresponds to the area of the pixel-defining layer 51, and so that the light-blocking portion 130 corresponds to the area of the spacer 52.

Next, a portion of the organic insulating material layer 50 that is exposed by the light-transmitting portion 110 may be removed during a subsequent etching process to expose the pixel electrode 41, and a portion of the organic insulating material layer 50 to which light is blocked by the light-blocking portion 130 may remain to form the spacer 52. A portion of the organic insulating material layer 50 through which light is partially transmitted may remain partially to form the pixel-defining layer 51. Accordingly, since the pixel-defining layer 51 and the spacer 52 are formed with each other using a single-mask process, the inconvenience of using two-mask processes in a conventional method may be avoided.

The partial-transmitting portion 120 used to form the pixel-defining layer 51 may have a light transmittance of about 40% to about 70%. If the exposure process is carried out when the partial-transmitting portion 120 has a light transmittance of about 40% to about 70%, then the pixel-defining layer 51 may have the thickness "h" (see FIG. 2) of about 4000 Å, which is less than a thickness of the spacer 52, and the taper angle θ (see FIG. 2) may be between about 15 degrees to about 30 degrees.

During the exposure process, defocusing, which causes a beam of light to be focused away from an exposed surface of the organic insulating material layer 50, may be performed. That is, if defocusing is carried out in such a manner that a beam of light is focused about 10 µm to about 15 µm from the exposed surface, then the sharpness of borders between the areas exposed through the light-transmitting portion 110 and the partial-transmitting portion 120 of the half-tone mask 100 may be reduced.

Accordingly, since the pixel area formed by the etching process after the exposure process is gradually inclined, the taper angle θ may also be small. Accordingly, if the taper angle θ is less than about 30 degrees, an ink droplet for forming the organic light-emitting layer 42 may more uniformly fill the pixel area, thereby reducing the risk of forming a poor quality pixel. If the taper angle θ is too small, however, then the pixel-defining layer 51 may fail to determine the size of a pixel. Therefore, the taper angle θ is typically greater than about 15 degrees.

The organic light-emitting display device of FIG. 1 may be manufactured by forming the pixel-defining layer 51 and the spacer 52 as described above, ejecting an ink droplet into the pixel area to form the organic light-emitting layer 42, and forming the second electrode 43, which is a common electrode, on the organic light-emitting layer 42.

Additionally, a protective layer (not shown) may be formed on the second electrode 43, and sealing may be performed by using, for example, glass.

As described above, since the organic light-emitting display device and the method of manufacturing the same according to the embodiments of the present invention form a pixel-defining layer and a spacer by using a single-mask process using a half-tone mask, a manufacturing process may be simplified. Furthermore, a uniform organic light-emitting layer may be formed by reducing a taper angle of the pixel-defining layer.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an organic light-emitting display device comprising:
    forming an organic insulating material layer on a pixel electrode;
    placing a half-tone mask comprising a light-blocking portion, a partial-transmitting portion, and a light-transmitting portion on the organic insulating material layer;
    performing an exposure process so that the pixel electrode corresponds to the light-transmitting portion, a pixel-defining layer at least partially surrounding the pixel electrode corresponds to the partial-transmitting portion, and a spacer adjacent to the pixel-defining layer corresponds to the light-blocking portion; and
    etching a portion of the organic insulating material layer so that a pixel area on the pixel electrode is at least partially surrounded by the pixel-defining layer and the spacer corresponding to the exposure process;
    wherein the pixel-defining layer has a thickness of less than about 4000 Å; and
    wherein the exposure process comprises a defocusing process, wherein at least one beam of light is focused away from an exposed surface of the organic insulating material layer.

2. The method of claim 1, wherein the defocusing process comprises focusing the at least one beam of light about 10 µm to about 15 µm from the exposed surface of the organic insulating material layer.

3. The method of claim 1, wherein a taper angle of the pixel-defining layer between the pixel electrode and the organic light-emitting layer in the pixel-defining layer is between about 15 degrees to about 30 degrees.

4. The method of claim 1, wherein the light-blocking portion has a light transmittance of about 0%, the partial-transmitting portion has a light transmittance of about 40% to about 70%, and the light-transmitting portion has a light transmittance of about 100%.

5. The method of claim 1, wherein the portion of the organic insulating material layer is exposed during the exposure process.

6. The method of claim 1, further comprising preparing the half-tone mask.

* * * * *